United States Patent
Henninger et al.

(10) Patent No.: US 6,833,584 B2
(45) Date of Patent: Dec. 21, 2004

(54) TRENCH POWER SEMICONDUCTOR

(75) Inventors: Ralf Henninger, München (DE); Franz Hirler, Isen (DE); Manfred Kotek, Villach (AT); Joost Larik, Poing (DE); Markus Zundel, Taufkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/165,912

(22) Filed: Jun. 10, 2002

(65) Prior Publication Data
US 2002/0185680 A1 Dec. 12, 2002

(30) Foreign Application Priority Data
Jun. 8, 2001 (DE) .......................................... 101 27 885

(51) Int. Cl.[7] .............................................. H01L 29/76
(52) U.S. Cl. ....................... 257/334; 257/328; 257/329; 257/330; 257/331; 257/332; 257/333
(58) Field of Search ................................ 257/328–334, 257/559

(56) References Cited

U.S. PATENT DOCUMENTS

| | | | | | |
|---|---|---|---|---|---|
| 4,941,026 | A | * | 7/1990 | Temple | 257/333 |
| 5,661,322 | A | * | 8/1997 | Williams et al. | 257/331 |
| 5,998,833 | A | * | 12/1999 | Baliga | 257/329 |
| 6,351,018 | B1 | * | 2/2002 | Sapp | 257/257 |
| 6,359,308 | B1 | * | 3/2002 | Hijzen et al. | 257/341 |
| 6,388,286 | B1 | * | 5/2002 | Baliga | 257/330 |
| 6,441,454 | B2 | * | 8/2002 | Hijzen et al. | 257/483 |
| 6,498,382 | B2 | * | 12/2002 | Hirler et al. | 257/510 |
| 6,521,497 | B2 | * | 2/2003 | Mo | 438/270 |
| 6,548,860 | B1 | * | 4/2003 | Hshieh et al. | 257/328 |
| 6,566,708 | B1 | * | 5/2003 | Grover et al. | 257/330 |

FOREIGN PATENT DOCUMENTS

DE 199 35 442 C1 12/2000

* cited by examiner

Primary Examiner—Tom Thomas
Assistant Examiner—Eugene Lee
(74) Attorney, Agent, or Firm—Laurence A. Greenberg; Werner H. Stemer; Gregory L. Mayback

(57) ABSTRACT

A trench power semiconductor component is described which has an edge cell in which an edge trench is provided. The edge trench, at least on an outer side wall, has a thicker insulating layer than an insulating layer of trenches of the cell array. This simple configuration provides a high dielectric strength and is economical to produce.

8 Claims, 2 Drawing Sheets

TRENCH POWER SEMICONDUCTOR

BACKGROUND OF THE INVENTION

Field of the Invention

The present invention relates to a trench power semiconductor component having a cell array and an edge termination which surrounds the latter and is composed of at least one edge trench which is lined with an insulating layer and is also filled with a conductive material which forms a field plate.

In the development of trench power semiconductor components, such as for example DMOS power transistors, the edge termination is of particular significance. This is because there are higher electrical field strengths in the edge of a power semiconductor component owing to the curvatures in the equipotential lines that inevitably occur there, so that the dielectric strength of the edge termination must be greater than the dielectric strength of the actual cells of the power semiconductor component. In addition, for reasons of cost, care must be taken to ensure that the edge termination takes up the smallest possible area in comparison with the cell array of the power semiconductor component because the edge termination as such is not, like the cell array, an active part of the component.

Therefore, for power semiconductor components an edge termination is aimed at which takes up as little area as possible and at the same time has a dielectric strength that is significantly greater than the dielectric strength of the actual cell array.

For many years intensive efforts have been made to fulfil this requirement and from the large number of publications that have arisen from this the following publications have been selected specifically with respect to trench power transistors. German Patent DE 199 35 442 C1 describes a method for manufacturing a trench MOS power transistor in which trenches are provided in the cell array with polycrystalline silicon as the field plate while trenches in the edge termination are lined with a field oxide layer made of silicon dioxide. Here, the field oxide layer is also drawn out onto the surface of the semiconductor element forming the power transistor in the cell array, which masks the implantation for the production of the source zone and body region.

International Patent Application PCT/EP00/8459 (10483) discloses a power semiconductor component with trenches in the active cell array, the trenches being provided on their side walls with insulating layers with different layer thickness in order to reduce the reactive capacitance. Further details on the problem of edge termination are not given here.

In addition, U.S. Pat. No. 5,763,915 discloses a DMOS power transistor configuration in which trenches which are wider than the trenches of the active cell array, and additionally are provided at a distance from one another, or from the outermost trench of the cell array, which differs from the distance between the trenches of the cell array, are used for the edge termination. The trenches of the cell array and of the edge termination are filled with polycrystalline silicon.

Finally, U.S. Pat. No. 4,941,026 describes a power semiconductor component in which trenches are lined with insulating layers that have a smaller layer thickness in an upper region of each trench than in a lower region thereof. Layer-shaped electrodes are applied to the insulating layers that are provided with two different layer thicknesses in this way.

Specific publications relating to the solution of the problems connected with the edge termination relating to trench power transistors with field plates in the trenches of the cell array and of the edge termination have not been disclosed hitherto.

SUMMARY OF THE INVENTION

It is accordingly an object of the invention to provide a trench power semiconductor component which overcomes the above-mentioned disadvantages of the prior art devices of this general type, which is distinguished by a configuration which is economical in terms of area and at the same time permits an edge termination which has a simple configuration and a high dielectric strength.

With the foregoing and other objects in view there is provided, in accordance with the invention, a trench power semiconductor component. The trench power semiconductor component contains a cell array having a trench formed therein and a first insulating layer lining the trench, and the first insulating layer has a first thickness. An edge cell surrounds the cell array and has at least one edge trench formed therein with an outer side wall in relationship to the cell array. The edge cell has a second insulating layer lining the edge trench and a conductive material at least partially fills the edge trench, and the conductive material forms a field plate. The second insulating layer of the edge trench has a second thickness that is greater than the first thickness at least on the outer side wall of the edge trench opposite the cell array.

The object is achieved according to the invention with a trench power semiconductor component of the type mentioned at the beginning by virtue of the fact that the insulating layer of the edge trench is made thicker at least on the outer side wall of the edge trench opposite the cell array than an insulating layer in trenches of the cell array.

In the trench power semiconductor component, the edge cell composed of the edge trench is preferably also supplemented by a "normal" trench of the cell array, namely the outermost trench of the cell array, and the semiconductor region that is positioned between the edge trench and the outermost trench and is composed, for example, of silicon.

The insulating layer which is of a thicker configuration on the outer side wall of the edge trench is located only in the edge trench and does not extend as far as the surface of the semiconductor element on the inner side in the direction of the cell array. In this way, masking resulting from the more thickly configured insulating layer during the implantations of source zone and body region is avoided so that lateral profile deformations for the source zone and the body region, and punches in the trench power semiconductor component caused by these deformations are avoided.

The inner side wall of the edge trench can be configured in various ways: it is thus possible to provide the same insulating layer with the same thickness for the inner side wall of the edge trench and the insulating layer in the trenches of the cell array. Furthermore, the inner side wall of the edge trench can be configured in the same way as the outer side wall. In this case, the more thickly executed insulating layer therefore extends both over the outer side wall and over the inner side wall, but it is to be noted that this more thickly configured insulating layer (thick oxide) is not located on the semiconductor surface between the edge cell and the cell array.

Furthermore, it is possible to allow the thick insulating layer to end at various levels on the inner side wall and then provide a thinner insulating layer (gate oxide) starting from the respective level.

In all of the variants, the edge trench is also filled with the conductive material, in particular polycrystalline silicon, so that in each case a field plate edge trench is provided, the extent of the field plate depending on the junction between the thick oxide and the gate oxide. The trench of the cell array is also filled with the conductive material being polycrystalline silicon.

The overall edge also generally includes a drain-end terminal that preferably contains a field plate of drain potential, with the purpose of a channel stopper in order to interrupt the formation of a channel between the drain and source in the case of a drain/source polarity reversal (see German Patent DE 199 35 442 C1).

In accordance with an added feature of the invention, a substrate is provided and the cell array and the edge cell are formed on and in the substrate. The substrate has a further edge trench formed therein and an additional conductive material fills the further edge trench. The additional conductive material and the conductive material are formed so as to be coherent.

In accordance with a further feature of the invention, the second insulating layer is formed of a field oxide or a thick oxide.

In accordance with another feature of the invention, the first insulating layer is a gate oxide.

In accordance with an additional feature of the invention, the second insulating layer is at least 20% thicker than the first insulating layer.

In accordance with a concomitant feature of the invention, the trench power semiconductor component is a trench power transistor.

Other features which are considered as characteristic for the invention are set forth in the appended claims.

Although the invention is illustrated and described herein as embodied in a trench power semiconductor component, it is nevertheless not-intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
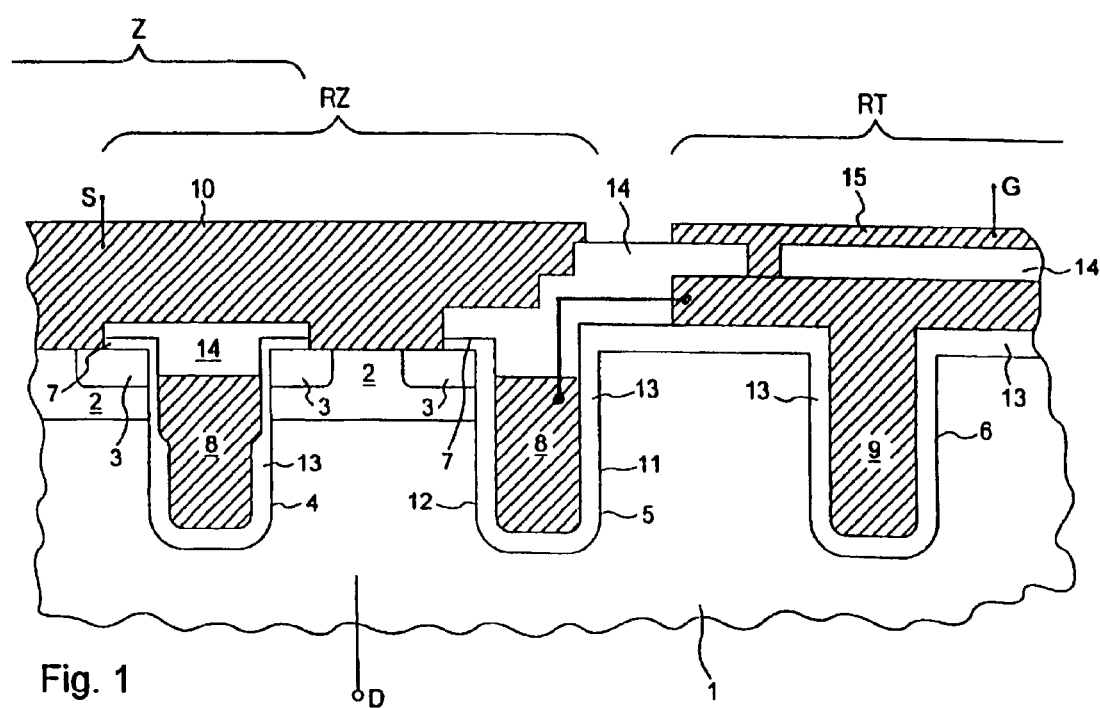
FIG. 1 is a diagrammatic, sectional view through a first exemplary embodiment of a trench power semiconductor component according to the invention.

Referring now to the figures of the drawing in detail and first, particularly, to FIG. 1 thereof, there is shown, in a sectional view, a trench power transistor with a cell array Z, an edge cell RZ made of a last trench 4 of the cell array Z and a first edge trench 5 and with further edge trenches RT, one edge trench 6 of which is illustrated. It is possible, if appropriate, to dispense with the further edge trenches RT. However, it is also possible to provide just one further edge trench RT, namely the edge trench 6.

In the cell array Z and in the edge cell RZ there is a trench power transistor made of a semiconductor element (i.e. substrate) 1 which is, for example, n-type conductive, and is composed of silicon or another suitable semiconductor material, for example SiC, $A_{III}B_{V}$, and so on, a p-type doped body region 2 and an n-type doped source zone 3.

The trench 4 is lined in its upper region with a relatively thin insulating layer 7 made of silicon dioxide (gate oxide or GOX) and in its lower region with a relatively thick insulating layer 13 made of silicon dioxide (field oxide or FOX). The insulating layer 7 is also partially disposed on a surface of the semiconductor element 1 which is adjacent to the trench 4 in the cell array Z. In an interior of the trench 4 and of the trench 5 and also of the trench 6 there is a conductive material, in particular polycrystalline silicon 8 or 9. If appropriate, silicides may also be used instead of polycrystalline silicon.

The polycrystalline silicon 8 forms gate electrodes in the trenches 4 and 5, while the polycrystalline silicon 9 forms, specifically in the trench 6, a field plate which is connected to a gate metallization 15 for a gate terminal G on an insulating layer 14 made of borophosphorous silicate glass (BPSG). Furthermore, a source metallization 10 is also provided for a source terminal S, and a drain terminal D is provided on the surface of the semiconductor element 1 lying opposite the source terminal S. The metallizations 10 and 15 may be composed, for example, of aluminum.

It is also to be noted that the polycrystalline silicon 8 of the trenches 4 and 5 is connected to the gate terminal G or the gate metallization 15 by conductive connections before or after the plane of the drawing.

According to the invention, the trench 5 that is located at the outer edge of the edge cell RZ is provided with the thicker insulating layer 13 (FOX) at least on its outer side wall 11. The thicker insulating layer can extend as far as an edge R (see FIG. 2) of the trench power semiconductor component. However, it does not extend beyond an inner side wall 12 of the trench 5. Instead, the thinner insulating layer 7 is provided there on the surface of the source zone 3.

The edge cell RZ is therefore composed of the last trench 4 of the cell array Z, which has the same structure as the other trenches of the cell array Z, and is lined with the gate oxide (above) or the field oxide FOX (below) and filled with polycrystalline silicon 8, and of the trench 5 which is provided on the outer side wall 11 with the thicker field oxide FOX and is also filled with polycrystalline silicon 8. The polycrystalline silicon 8 of the trench 5 can be coherent with the polycrystalline silicon of the further trench 6 or else be separated from it. In addition, it is possible also to provide a plurality of edge trenches corresponding to the trench 6 and/or a plurality of normal trenches corresponding to the trench 5 for the edge cell RZ. The cell array Z can be composed of a plurality of trench power transistors of the type represented. The power transistors are then connected parallel to one another.

Figure 2:
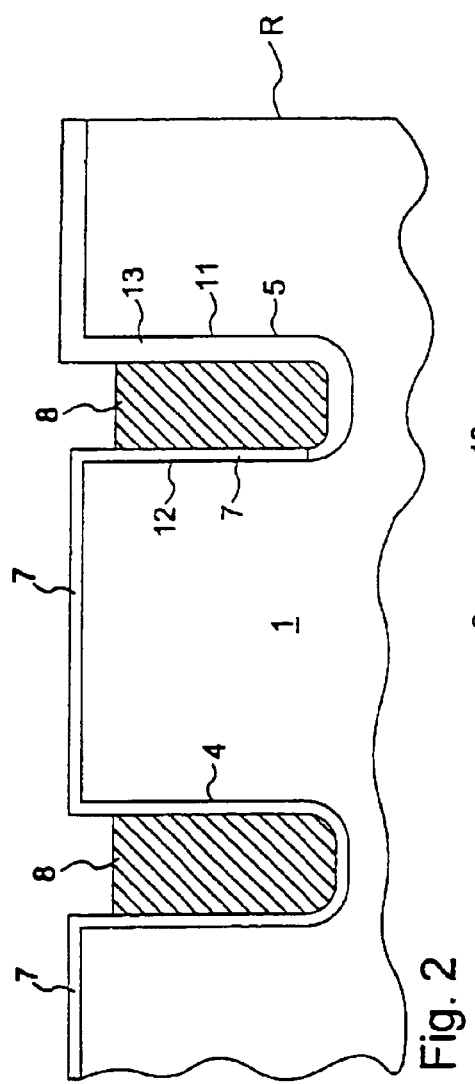
FIG. 2 is a sectional view through an edge cell according to a second exemplary embodiment.
Figure 5:
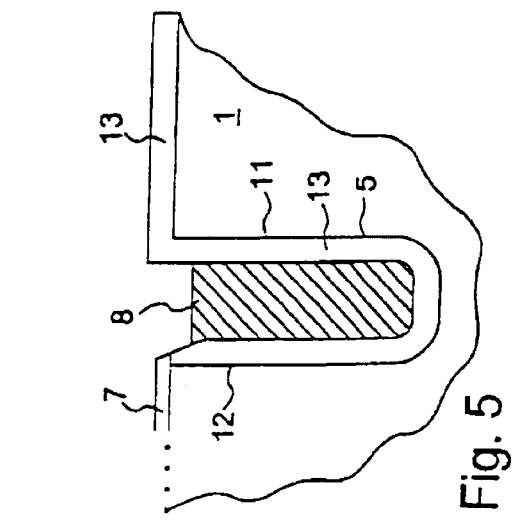
FIG. 5 is a sectional view through the edge trench according to a fifth exemplary embodiment.
Figure 4:
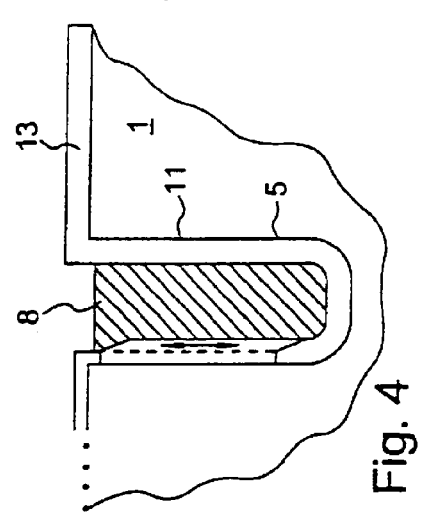
FIG. 4 is a sectional view through the edge trench according to a fourth exemplary embodiment.
Figure 3:
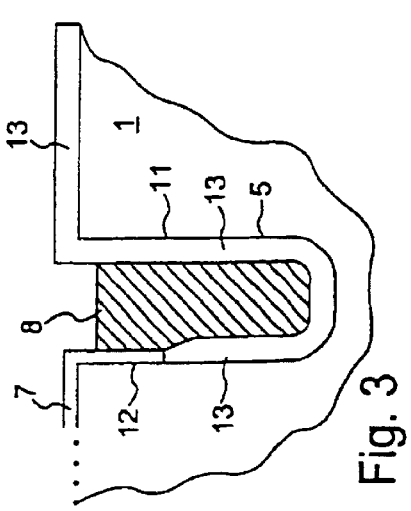
FIG. 3 is a sectional view through an edge trench according to a third exemplary embodiment.

In the exemplary embodiment in FIG. 2, only one edge cell RZ is illustrated, while the exemplary embodiments in FIGS. 3 to 5 show only the edge trench corresponding to the trench 5. Furthermore, the exemplary embodiments in FIGS.

2 to 5 are structured in a similar way to the exemplary embodiment in FIG. 1.

Although FIG. 1 shows a vertical structure of the trench power transistor, it is of course also possible to have a lateral configuration in which the drain terminal D is provided on the same surface as the gate terminal G and the source terminal S.

FIG. 2 shows the edge cell RZ with the normal trench 4, which is provided so as to be continuous with the thin insulating layer 7 (gate oxide) like the other trenches of the cell array, while the edge trench 5 is provided here on the outer side wall 11 with the thicker insulating layer 13 (field oxide) and on an inner side wall 12 with the thinner insulating layer 7 (field oxide) and is also filled with polycrystalline silicon 8. In the exemplary embodiment in FIG. 2, the field oxide extends approximately as far as the bottom of the trench 5.

FIGS. 3 to 5 show different configuration possibilities for the edge trench 5. The field oxide which forms the thicker insulating layer 13 can extend approximately as far as halfway along the inner side wall 12 (see FIG. 3) or may end higher or lower (see FIG. 4). It is also possible for the field oxide that forms the thicker insulating layer 13 to extend as far as the end of the inner side wall 12 (see FIG. 5). In other words, the field plate formed by the polycrystalline silicon 8 can lie at a higher or lower position in the trench 5 in comparison with the trench 4 of the cell array Z, and thus extend directly as far as the topmost edge of the trench, as illustrated in FIG. 5.

The field oxide has a layer thickness that is approximately 20% greater than the layer thickness of the gate oxide and extends from 0.1 to 2.0 µm, while the gate oxide has layer thicknesses of 0.05 to 0.1 µm.

We claim:

1. A trench power semiconductor component, comprising:
   a cell array having a cell array trench formed therein and a first insulating layer lining said cell array trench, said first insulating layer having a first thickness, and said cell array trench having an outer side wall in relationship to said cell array;
   an edge cell surrounding said cell array and having at least one edge trench formed therein with an inner side wall and an outer side wall in relationship to said cell array, said edge trench having a second insulating layer lining said edge trench and a conductive material at least partially filling said edge trench, said conductive material forming a field plate; and
   a body region extending between said outer side wall of said cell array trench and said inner side wall of said edge trench;
   said second insulating layer of said edge trench having a second thickness being greater than said first thickness at least on said entire outer side wall of said edge trench opposite said cell array and on said inner side wall.

2. The trench power semiconductor component according to claim 1, wherein said cell array has a further conductive material at least partially filling said cell array trench, and said edge cell includes said cell array trench filled with said further conductive material and lined with said first insulating layer having said first thickness being less than said second thickness of said second insulating layer lining said edge trench.

3. The trench power semiconductor component according to claim 2, wherein said conductive material and said further conductive material are formed from a polycrystalline silicon.

4. The trench power semiconductor component according to claim 2, further comprising:
   a substrate having said cell array and said edge cell formed on and in said substrate, said substrate having a further edge trench formed therein; and
   an additional conductive material filling said further edge trench, said additional conductive material and said conductive material formed so as to be electrically connected to each other.

5. The trench power semiconductor component according to claim 1, wherein said second insulating layer is formed of a material selected from the group consisting of field oxides and thick oxides.

6. The trench power semiconductor component according to claim 5, wherein said second insulating layer is at least 20% thicker than said first insulating layer.

7. The trench power semiconductor component according to claim 1, wherein said first insulating layer is a gate oxide.

8. The trench power semiconductor component according to claim 1, wherein the trench power semiconductor component is a trench power transistor.

* * * * *